(12) United States Patent
Melis et al.

(10) Patent No.: US 9,577,798 B1
(45) Date of Patent: Feb. 21, 2017

(54) REAL-TIME SEPARATION OF SIGNAL COMPONENTS IN SPECTRUM ANALYZER

(71) Applicant: Keysight Technologies, Inc., Minneapolis, MN (US)

(72) Inventors: Joeri Melis, Herent (BE); Adnan Al-Adnani, Brussels (BE); Zeger Hendrix, Leuven (BE); Lieven Philips, Aarschot (BE); Gery Verhaegen, Vlaams Brabant (BE)

(73) Assignee: Keysight Technologies, Inc., Santa Rosa, CA (US)

( * ) Notice: Subject to any disclaimer, the term of this patent is extended or adjusted under 35 U.S.C. 154(b) by 201 days.

(21) Appl. No.: 14/265,741

(22) Filed: Apr. 30, 2014

(51) Int. Cl.
*H04L 5/00* (2006.01)

(52) U.S. Cl.
CPC .................................. *H04L 5/0005* (2013.01)

(58) Field of Classification Search
CPC ...... H04L 5/0012; H04L 43/50; H04L 5/0005; H04B 1/69; H04B 1/713; H04B 1/7136; H04B 1/715
See application file for complete search history.

(56) References Cited

U.S. PATENT DOCUMENTS

| | | | | |
|---|---|---|---|---|
| 7,151,790 B1* | 12/2006 | Patenaude | ............ | H04B 1/7156 370/330 |
| 7,577,570 B2* | 8/2009 | Kjoerling | ............ | G10L 19/0204 370/240 |
| 7,885,421 B2 | 2/2011 | Feldhaus et al. | | |
| 2012/0065983 A1* | 3/2012 | Ekstrand | ............... | G10L 21/038 704/500 |
| 2012/0195442 A1* | 8/2012 | Villemoes | ............. | G10L 19/265 381/98 |
| 2012/0308029 A1* | 12/2012 | Christoph | .......... | H03H 17/0229 381/71.12 |
| 2013/0064328 A1* | 3/2013 | Adnani | .................. | H04B 1/006 375/340 |
| 2014/0314002 A1* | 10/2014 | Hanson | .................. | H04B 7/026 370/329 |

* cited by examiner

*Primary Examiner* — Chi H Pham
*Assistant Examiner* — Weibin Huang

(57) ABSTRACT

Filterbank windowing and Fourier transformation are used to distinguish sub-bands of interest from other sub-bands of an input signal. The sub-bands of interest are selected and then subjected to additional windowing and Fourier transformation.

20 Claims, 9 Drawing Sheets

REAL-TIME SEPARATION OF SIGNAL COMPONENTS IN SPECTRUM ANALYZER

BACKGROUND

Spectrum analyzers are commonly used to analyze the frequency spectra of electronic devices and components. Typically, the spectrum analyzer receives an input signal in the time domain, converts it to the frequency domain (e.g., by Fourier transform), and then displays the converted signal in a graph.

Unfortunately, certain types of signals may be difficult to measure and analyze in a conventional spectrum analyzer due to their irregular form. For example, frequency hopping signals, which are used in many communications applications, may be sparsely distributed in the frequency domain, making it difficult to display them with adequate time and/or frequency resolution.

Due to this difficulty, conventional approaches to analyzing frequency hopping signals tend to rely on compromises to simplify the analysis. For example, in one conventional approach, a spectrum analyzer examines frequency hopping signals with a wide instantaneous bandwidth. The use of a wide instantaneous bandwidth, however, limits the resolution and thus the visible details of the signals shape/modulation. Moreover, this problem increases as the bandwidth of the signal under test gets smaller compared to the entire hopping bandwidth.

In another conventional approach, a spectrum analyzer analyzes only a fraction of the signals occurring at one specific hop frequency. Analyzing only a fraction of a signal allows it to be analyzed with relatively high resolution. However, it increases the time needed to obtain an accurate measurement as only a tiny fraction of the entire signal is analyzed. Moreover, by not looking at the entire bandwidth it also makes it difficult to link specific effects to particular hopping patterns.

In yet another conventional approach, a device under test (DUT) is altered to avoid hopping (and a sparse use of the frequency domain). Turning off hopping, however, results in testing the DUT outside its normal operation and can thus only provide partial results.

In view of these and other shortcomings of conventional approaches, there is a general need for improved approaches for analyzing frequency hopping signals in spectrum analyzers.

SUMMARY

In a representative embodiment, a method comprises applying filterbank windowing to an input signal to produce a first number of samples in the time domain, transforming the samples in the time domain into a first number of bins in the frequency domain, selecting at least one sub-band of the input signal based on the first number of bins, applying windowing to the at least one sub-band to produce a second number of samples in the time domain for each sub-band, and transforming the second number of samples in the time domain into a second number of bins in the frequency domain.

In another representative embodiment, a system comprises a filterbank windowing module configured to apply filterbank windowing to an input signal to produce a first number of samples in the time domain, a first transform module configured to transform the first number of samples in the time domain into a first number of bins in the frequency domain, a sub-band selection module configured to select at least one sub-band of the input signal based on the first number of bins, a windowing module configured to apply windowing to the at least one sub-band to produce a second number of samples in the time domain for each sub-band, and a second transform module configured to transform the second number of samples in the time domain into the second number of bins in the frequency domain.

BRIEF DESCRIPTION OF THE DRAWINGS

The described embodiments are best understood from the following detailed description when read with the accompanying drawing figures. Wherever applicable and practical, like reference numerals refer to like elements.

DESCRIPTION

Figure 1:
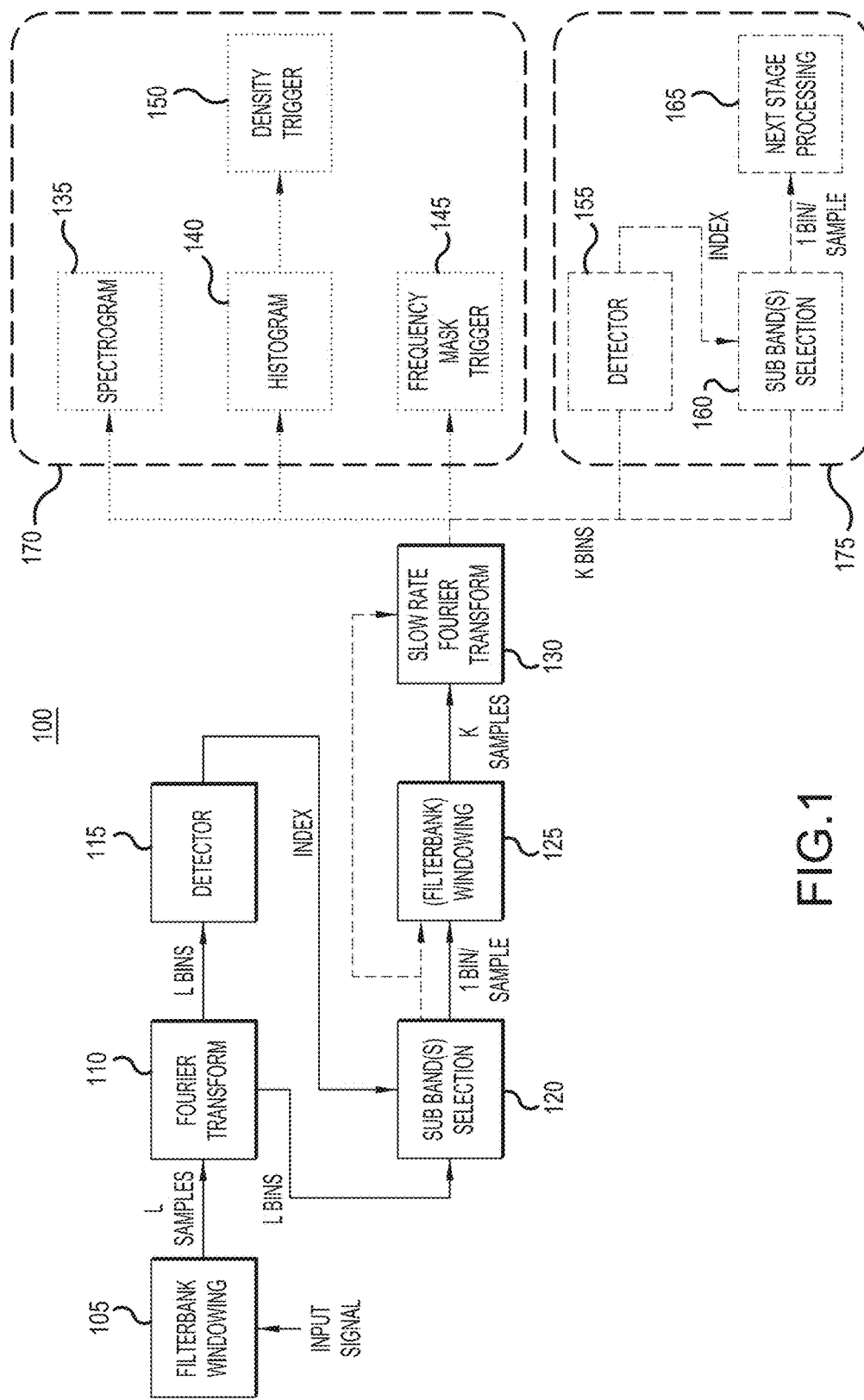
FIG. 1 is a block diagram illustrating a signal analysis pathway of a spectrum analyzer, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices. As used in the specification and appended claims, and in addition to their ordinary meanings, the terms 'substantial' or 'substantially' mean to within acceptable limits or degree. As used in the specification and the appended claims and in addition to its ordinary meaning the term 'approximately' means to within an acceptable limit or amount to one having ordinary skill in the art. For example, 'approximately the same' means that one of ordinary skill in the art would consider the items being compared to be the same.

The term 'module' or 'block' denotes any set of features configured to perform a designated function. For instance, the term "filterbank windowing module" may refer to hardware and/or software configured to perform filterbank windowing functions. The features of a module or block can be configured in any suitable fashion; for example, they can be disposed in a single location or distributed across various components of a system. Moreover, the features of different modules or block are not necessarily exclusive of other modules or blocks. For example, the same feature (e.g., processing hardware) could be used as part of multiple different modules or blocks.

The described embodiments relate generally to spectrum analyzers and related signal processing functions. In certain embodiments, a spectrum analyzer uses a multi-stage signal processing approach to identify portions of the frequency spectrum having a relatively high concentration of power, and to selectively zoom in on those portions while ignoring gaps between them. One application of this multi-stage approach is the analysis of frequency hopping signals, which may only occupy a small portion of the spectrum analyzer's frequency range.

In one implementation of the multi-stage approach, a spectrum analyzer uses filterbank windowing to split a wideband input signal into several sub-bands. It then transforms the sub-bands from the time domain to the frequency domain and selects N sub-bands of interest (N≥1) based on a frequency domain analysis of the transformed sub-bands. The samples of each of the selected sub-bands form part of one or more different time domain streams, in contrast to systems where each sub-band is mapped to a single time domain stream. This avoids a requirement for an inverse Fourier transform to recombine multiple sub-bands into a single time domain stream. Next, the spectrum analyzer performs further windowing on each of the N parallel time domain streams of the selected sub-bands, and transforms the resulting time domain samples into the frequency domain for analysis.

The selection of sub-bands can be done at fixed locations if such locations are known in advance. This option may be well suited to removing frequency domain sparseness in modern multi-carrier cellular environments so that the available resources can be optimized to give the best possible resolution inside the signal of interest. Alternatively, the selection of sub-bands can be done dynamically by detecting which sub-bands contain the desired signal after analyzing the output of the first stage. This option may be well suited to do an automated track and zoom of frequency hopping signals. When using the dynamic option, determining the frequency band to which the DUT will jump to is often not possible without demodulation. But it is generally known there is only a limited number of sub-bands in use at one time one, e.g., one selected sub-band and possibly adjacent sub-bands used to detect weak transients. By detecting the location of the signal, the spectrum analyzer can focus more resources to provide improved resolution. If either a priori information of the input signal in different sub-bands is available or a detector (e.g., in detection module 115 of FIG. 1) is capable of identifying signal characteristics, it can also improve subsequent processing of the signal (e.g., by windowing module 125 and/or second FT module 130 of FIG. 1). For instance if it is known that only long lasting complex signals occur in a particular sub-band window, coefficients optimized for frequency resolution and a long transform length could be selected if that sub-band was selected while if a signal in other sub-bands is detected different window coefficients or even a shorter transform length could be used.

FIG. 1 is a block diagram illustrating a spectrum analyzer 100, according to a representative embodiment. Spectrum analyzer 100 is a simplified example and is not intended to illustrate al of the possible visualization and usage modes, nor all of the digital signal processing (DSP) options that may be included in various embodiments.

Referring to FIG. 1, spectrum analyzer 100 comprises a filterbank windowing module 105, a first Fourier transform (FT) module 110, a detection module 115, a sub-band selection module 120, a windowing module 125, and a second FT module 130. It further comprises a display block 170 for displaying histogram and spectrogram data, and a high resolution processing block 175 for optional high resolution processing of data output by second FT module 130. Display block 170 comprises a spectrogram display 135, a histogram display 140, one or more frequency mask triggers 145, and one or more density triggers 150. High resolution processing block 175 comprises an additional detection module 155, an additional sub-band selection module 160, and next stage processing component 165.

Display block 170 is shown with dotted lines to distinguish it from signal processing components that generate the data to be displayed. High resolution processing block 175 is shown with dashed lines to indicate that it is optional and could be repeated any number of times in order to zoom in on an input signal with arbitrarily high resolution. Typically, display block 170 is located at an output of the last stage of signal processing in order to display the resulting data. Upon request by a user, however, it can be connected to the output of any stage, e.g. first FT module 110 or next stage processing component 165. An analyzer could also implement more than one simultaneous display block to allow the simultaneous visualization of signal aspects with different zoom factors.

During typical operation of spectrum analyzer 100, a digitized input signal is provided to filterbank windowing module 105, which applies filterbank windowing to produce windowed samples. The use of filterbank windowing makes it possible to create filter shapes that allow dividing the input signal into well separated sub-bands, as illustrated, for example, in FIG. 2.

Next, first FT module 110 transforms the windowed samples from the time domain to the frequency domain. This transformation is typically a limited length FT, which usually requires less processing resources than a traditional length FT. In embodiments used to generate the data of FIGS. 4-7, the limited length FT has a length of 8 samples to improve readability, although practical scenarios may use a longer length, and thus a longer zoom factor. The use of filterbank windowing in this context tends to provide better separation between different sub-bands, compared to traditional windowing.

The filterbank windowing and FT of the input signal can be viewed as a first stage of processing, which results in a set of bins representing a frequency response of the input signal. In some contexts, this frequency response could be displayed on the spectrum analyzer without further processing. However, in spectrum analyzer 100, one or more additional processing stages are used to zoom in on selected portions of the frequency spectrum.

Detection module 115 receives the bins output by first FT module 110, and it detects sub-bands of interest based on the received bins. It then outputs one or more index values indicating the selected sub-bands. Typically, the selected sub-bands will correspond to collections of adjacent bins with relatively high power, and possibly neighboring sub-bands as well. For instance, when analyzing a frequency hopping signal, the selected sub-bands may correspond to hopping frequencies where information is being transmitted. In some alternative implementations, detection module 115 can be omitted or disabled if a signal frequency pattern is known a priori. In such a case, sub-bands may be selected based on this a priori information rather than analyzing the bins output by first FT module 110. For example, in the case of separated frequency separate fixed transmissions (e.g., multi-carrier LTE-A), all sub-bands with a priori known content will be selected.

Sub-band selection module 120 receives the index values produced by detection module 115, and it selects one or more sub-bands of the input signal based on the index values. The selection of sub-bands may comprise, for instance, applying a frequency mask to the input signal.

Where a single hopping signal is tracked and first-in-first-out (FIFO) resources are available, sub-band selection module 120 may also allow a small head and tail section to be added to each selected sub-band. If this is done, some signals that are too weak to reliably trigger a frequency mask would show up, but it would also introduce a small required dead time for the input signal. But this dead time typically exists as the input signal is typically generated with a single radio-frequency (RF) frontend which is also silenced during the transition to minimize out of band interference.

In addition to outputting data, sub-band selection module 120 may also output configuration information for configuring windowing module 125 and/or second FT module 130, as indicated by dotted arrows. Accordingly, windowing module 125 and second FT module 130 may be configured according to the input signal based on the L bins. Among other things, the configuration information may be used to modify windowing coefficients of windowing module 125 according to the bins output by first FT module 110, and it may be used to adjust the transform length of second FT module 130.

Such modifications and adjustments may improve various aspects of the spectrum analyzer performance, such as the resolution or clarity of displayed information, or the efficiency of processing, for example.

Figure 2:
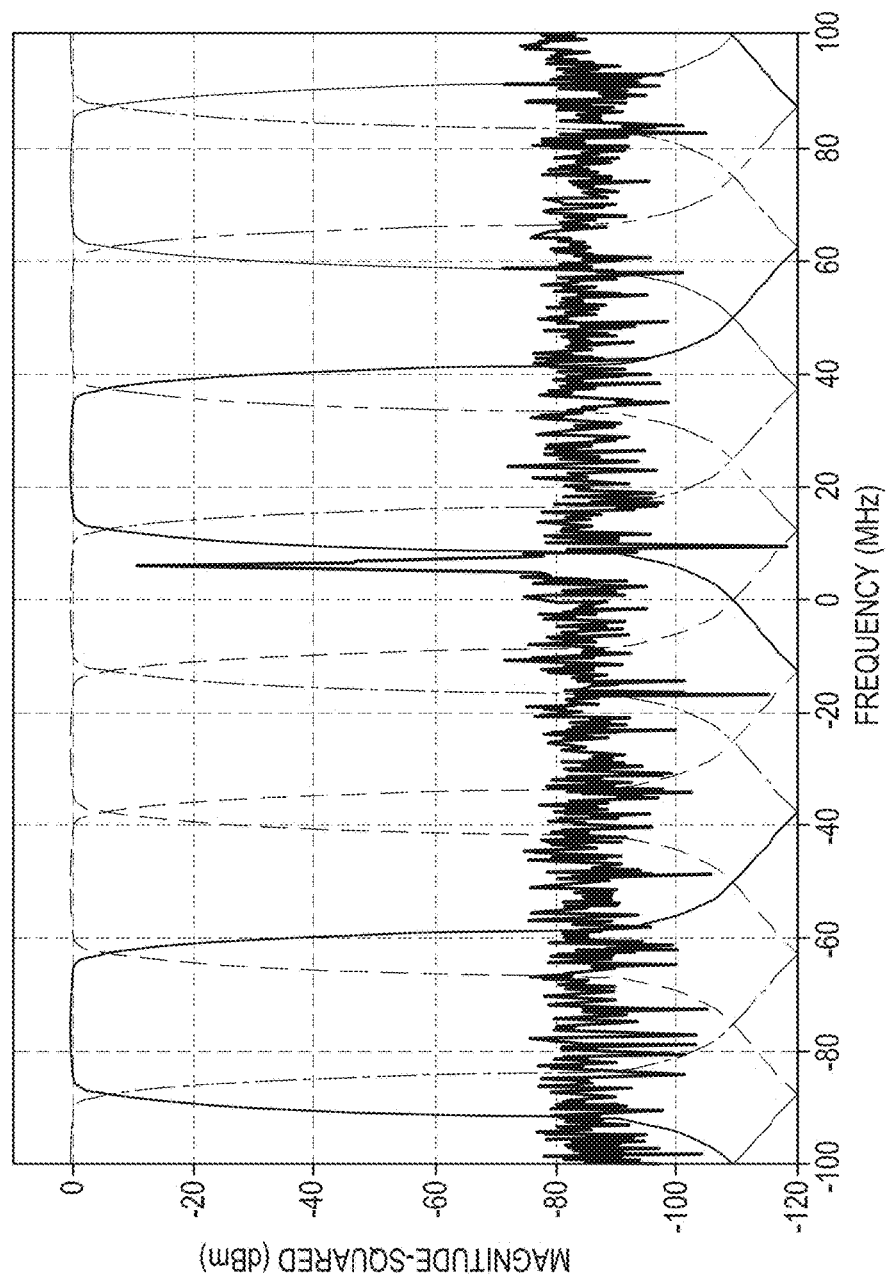
FIG. 2 is a graph illustrating a channel structure of a signal produced by filterbank windowing in the signal analysis pathway of FIG. 1, according to a representative embodiment.

FIG. 2 shows examples of filter responses that may be used by sub-band selection module 120 to implement such a frequency mask. Referring to FIG. 2, the FT of the input signal includes a large peak between zero and 20 MHz. The corresponding sub-band, which is defined by an illustrated filter response with a passband between approximately −3 dB and 0 dB, may be selected by sub-band selection module 120 in order to analyze the frequency response at higher resolution.

Referring again to FIG. 1, windowing module 125 receives the selected sub-band from sub-band selection module 120, and it performs windowing on the received sub-band to produce samples to be processed by second FT module 130. If N (with N>1) sub-band are selected this block will be implemented N times in parallel Windowing module 125 may perform filterbank windowing or traditional windowing to process the selected sub-band. The determination to use filterbank windowing may be based on user preference and/or availability of resources.

Second FT module 130 transforms the samples produced by windowing module 125 from the time domain to the frequency domain. The resolution obtained using two stages of transformation is the length of samples of both stages multiplied together. Similar to windowing module 125, this module will be implemented N times in parallel if N rather than 1 sub-band were selected. The output produced by second FT module 130 can either be transmitted to display block 170 for user observation, or it can be transmitted to high resolution processing block 175 for further detection of features of interest by additional detection module 155, further sub-band selection by additional sub-band selection module 160, and further windowing and/or Fourier transform by processing by next stage processing component 165.

Figure 3:
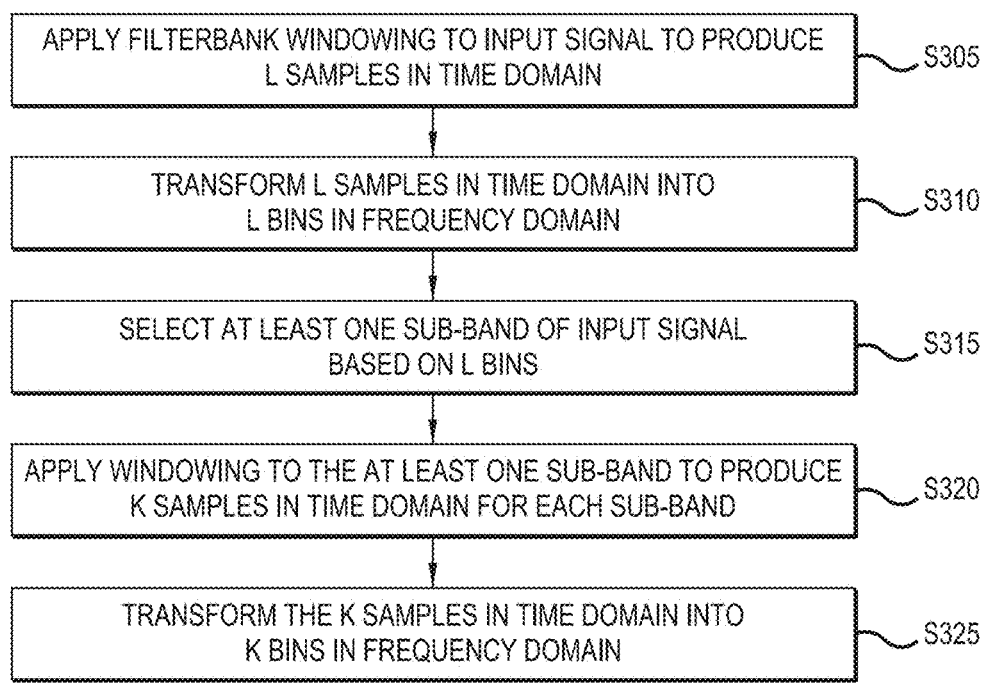
FIG. 3 is a flowchart illustrating a method of processing an input signal in a spectrum analyzer, according to a representative embodiment.

FIG. 3 is a flowchart illustrating a method 300 of processing an input signal in a spectrum analyzer, according to a representative embodiment. The method of FIG. 3 could be performed by spectrum analyzer 100, for example, although it is not restricted to this or any other particular system implementation.

Referring to FIG. 3, the method comprises applying filterbank windowing to an input signal to produce a first number (hereafter, "L") of samples in the time domain (S305), transforming the L samples in the time domain into L bins in the frequency domain (S310), selecting at least one sub-band of the input signal based on the L bins (S315), applying windowing to the at least one sub-band to produce a second number (hereafter, "K") of samples in the time domain for each sub-band (S320), and transforming the K samples in the time domain into K bins in the frequency domain (S325). In a typical implementation operations S320 and S325 may be performed at a reduced rate compared to those of operations S305 and S310 as the number of sub-bands selected is less than L. The transformations performed in operations S310 and S325 are typically Fourier transformations.

In operation S315, the selection of at least one sub-band may comprise analyzing the L bins and detecting the at least one sub-band based on the analysis, or it may comprise selecting at least one sub-band having a priori known frequency content. In operation S325, applying windowing to the at least one sub-band to produce K samples in the time domain for each sub-band comprises applying filterbank windowing to the at least one sub-band.

Following operation S325, the resulting data may be displayed or it may be subjected to further processing, as explained above in relation to FIG. 1, for example. The display data may include, for instance, a density histogram or a spectrogram, as illustrated in various examples shown in FIGS. 4 through 7.

Figure 4A:
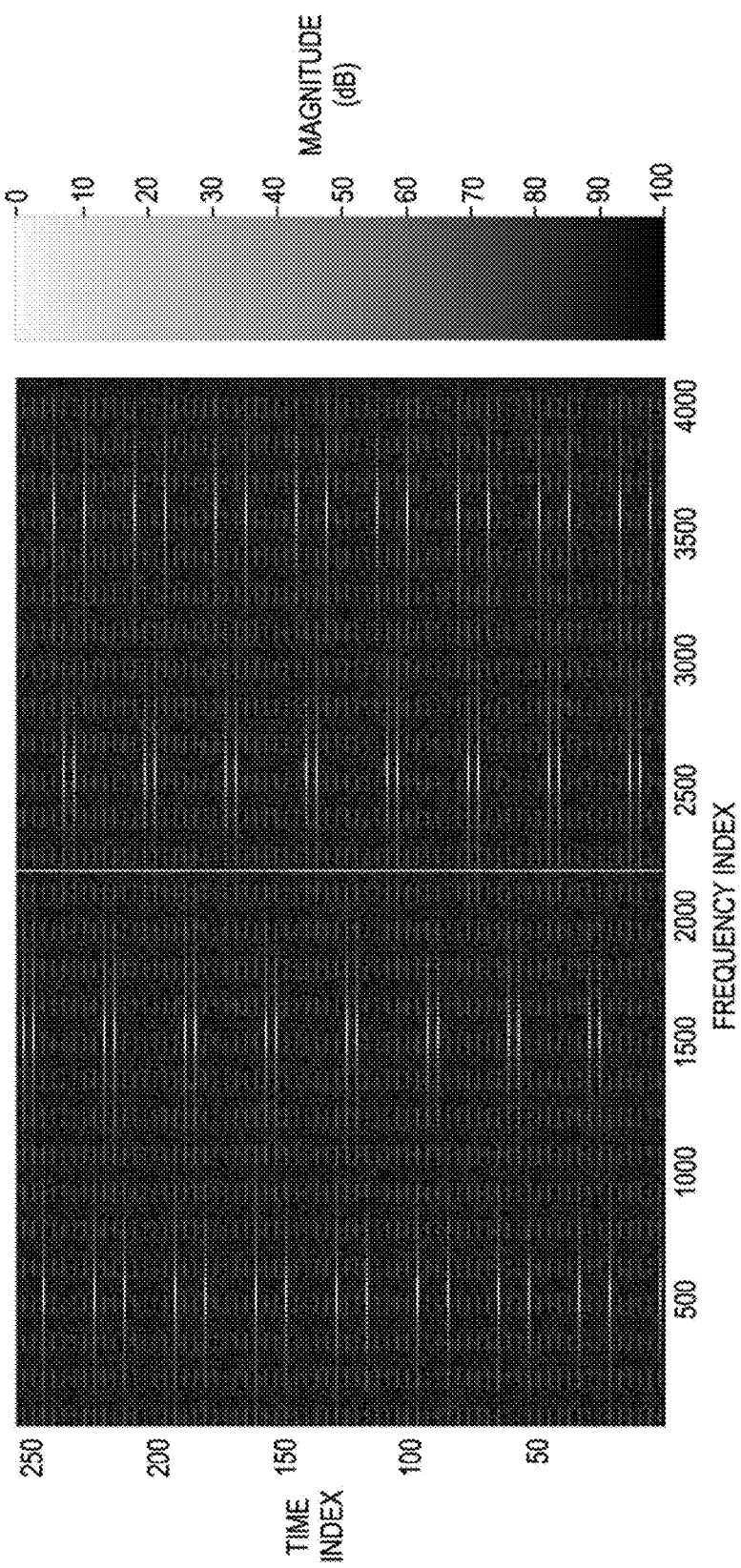
FIG. 4A is a spectrogram of a signal under test, according to a representative embodiment.
Figure 4B:
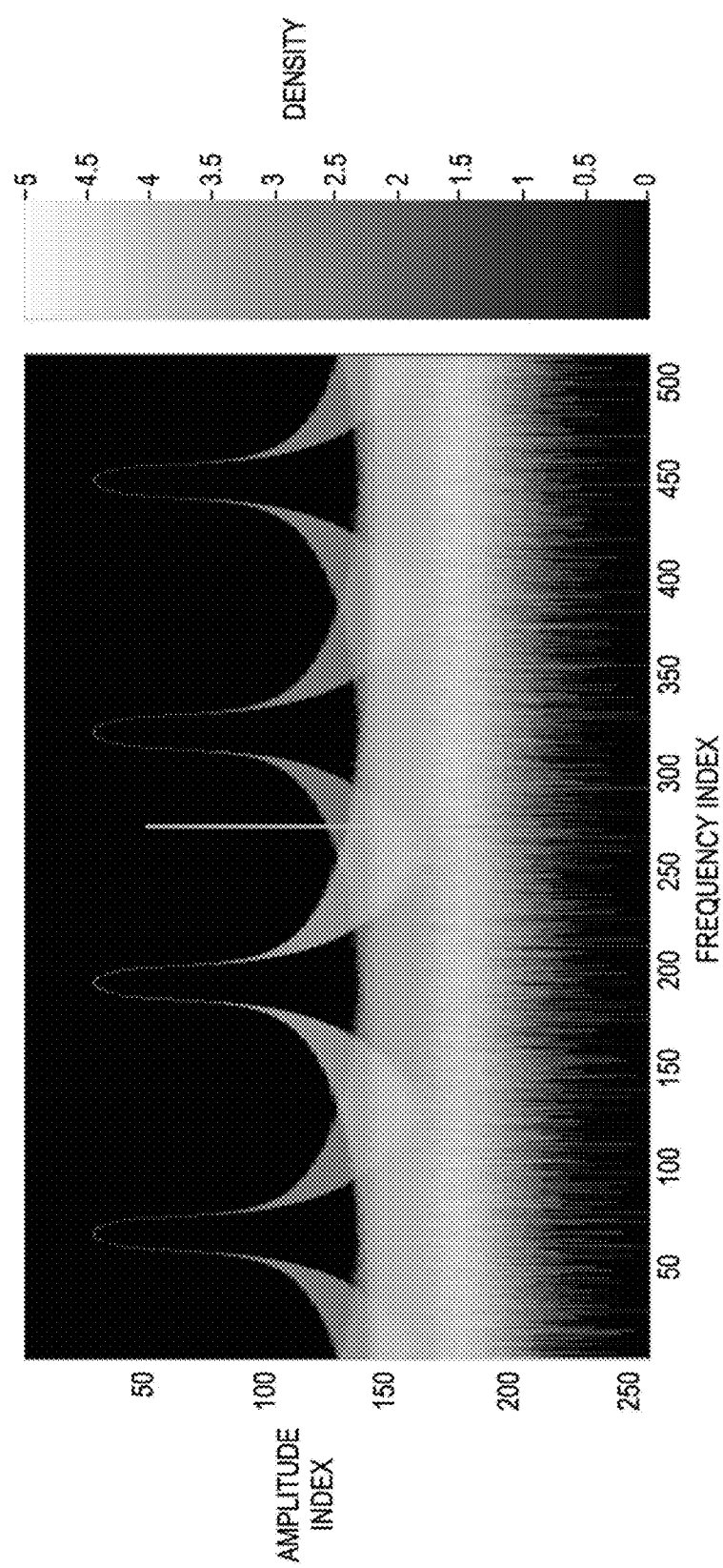
FIG. 4B is a density histogram of a signal under test, according to a representative embodiment.
Figure 5A:
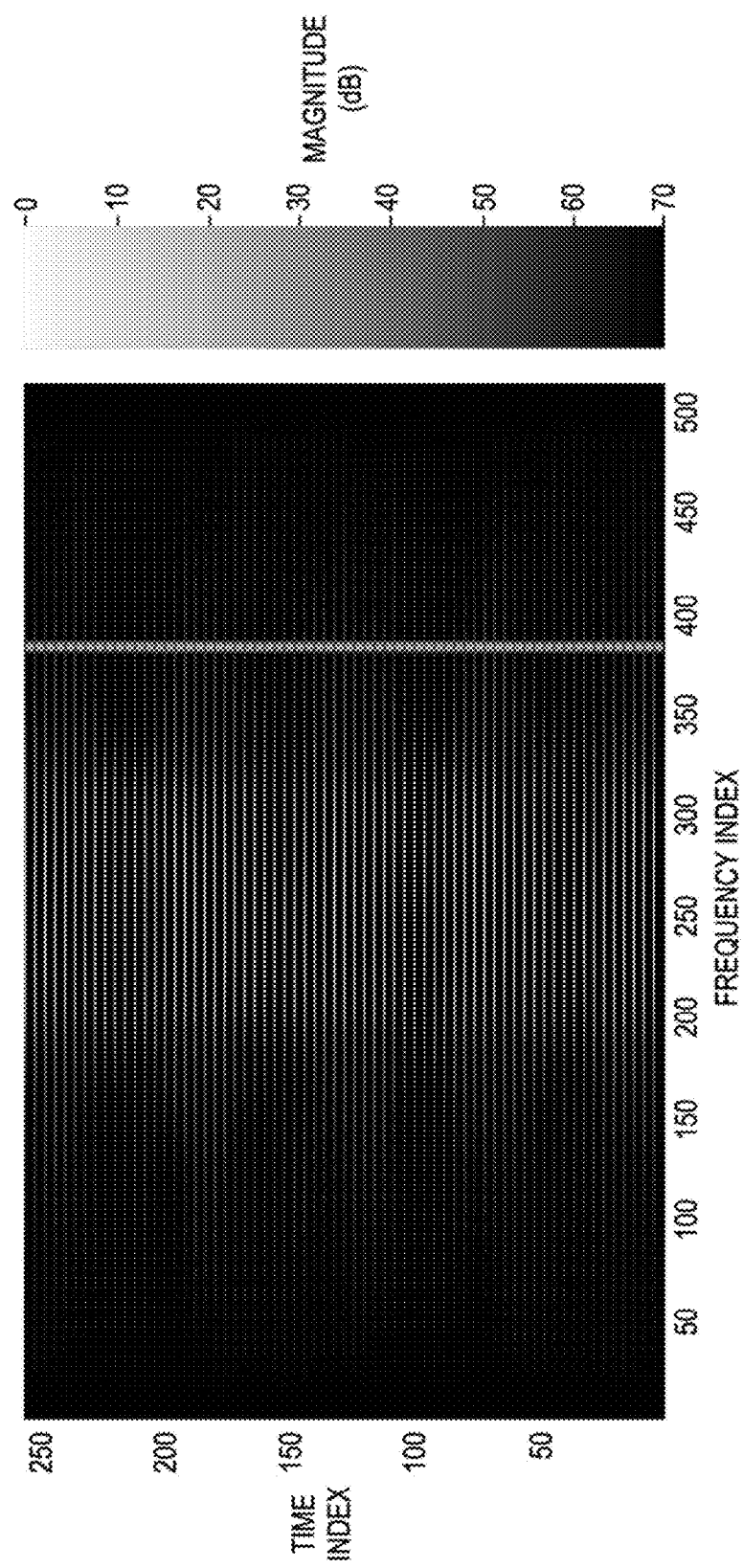
FIG. 5A is a spectrogram of a signal under test, according to a representative embodiment.
Figure 5B:
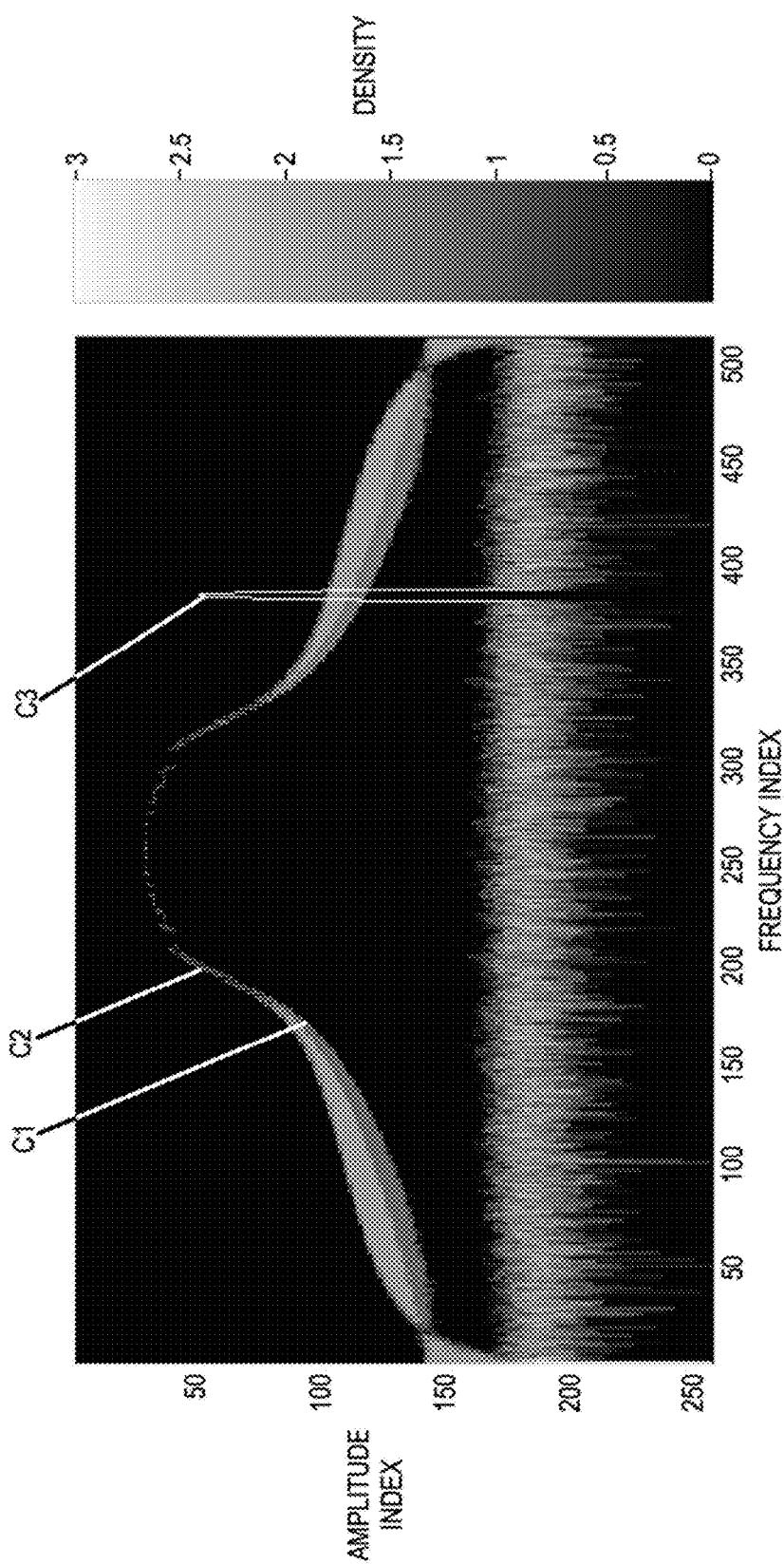
FIG. 5B is a density histogram of a signal under test, according to a representative embodiment.
Figure 6:
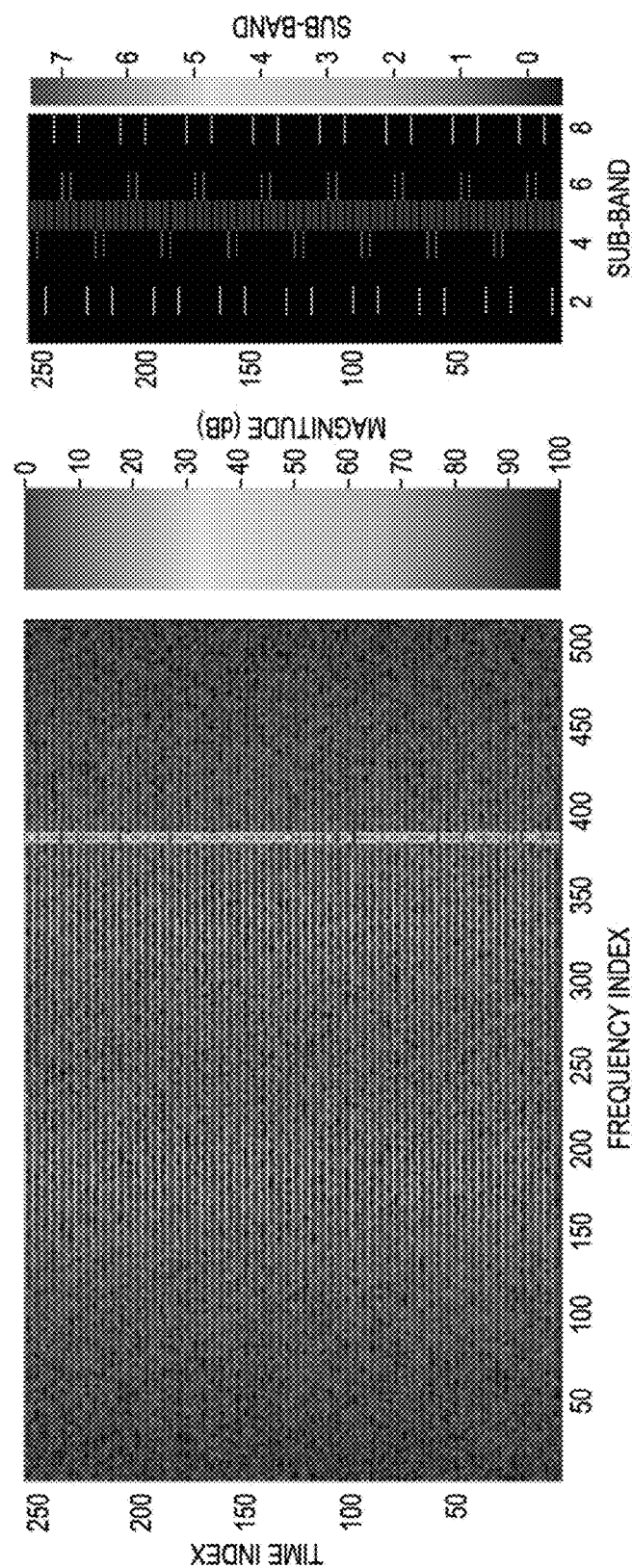
FIG. 6 is a spectrogram of a signal under test, together with sub-band index information for the spectrogram, according to a representative embodiment.
Figure 7:
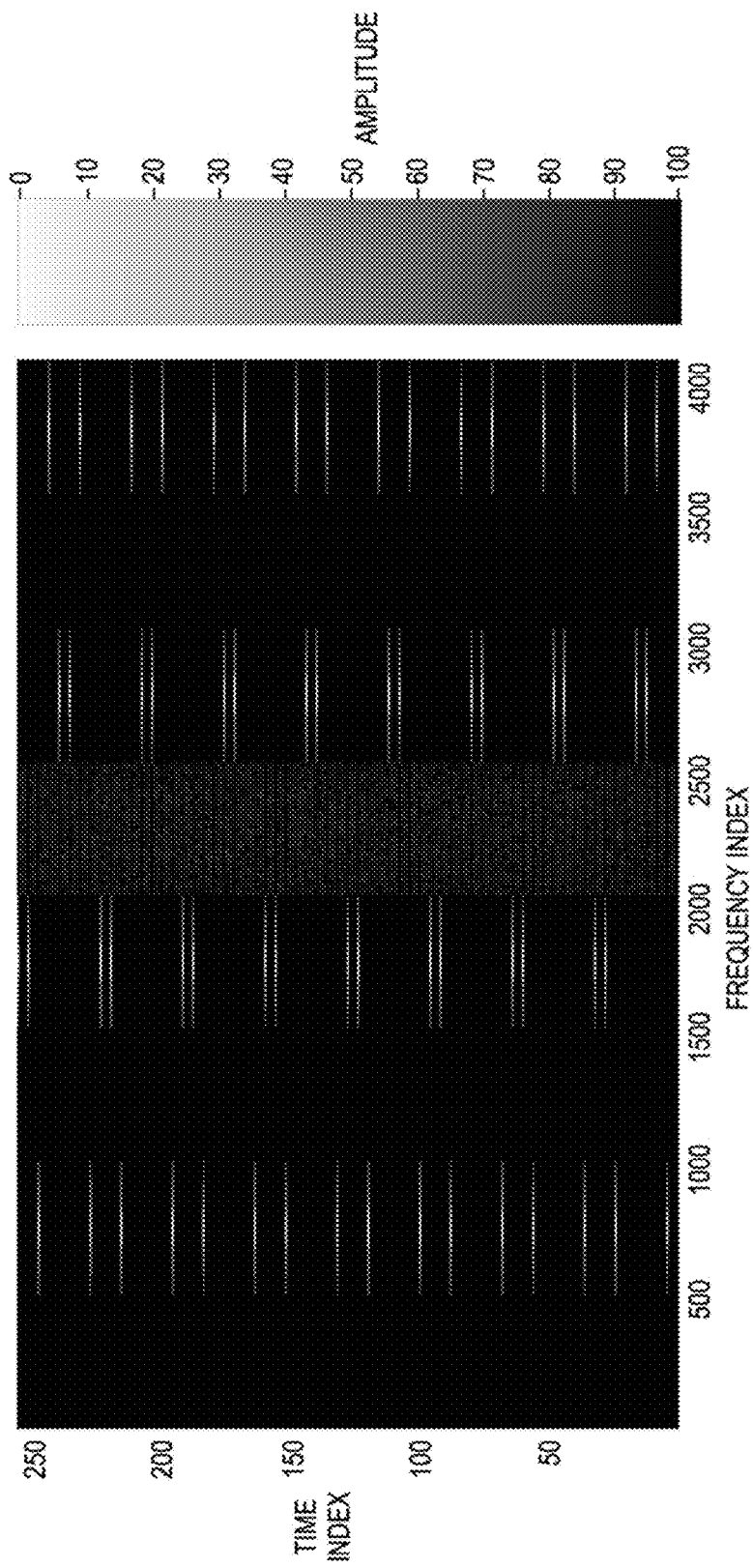
FIG. 7 is a spectrogram of a signal under test, showing frequency spectra only for selected sub-bands, according to a representative embodiment.

FIGS. 4A and 4B are a spectrogram and a density histogram, respectively, of a signal under test. FIGS. 5A and 5B are a spectrogram and a density histogram, respectively, of multiple selected sub-bands of the same signal under test. FIG. 6 is a spectrogram of the signal under test, together with sub-band index information for the spectrogram. FIG. 7 is a spectrogram of the signal under test, showing frequency spectra for selected sub-bands across the full bandwidth of the signal under test.

In the examples illustrated in FIGS. 4 through 7, the signal under test was generated synthetically and comprises a static carrier, a bi-directional chirp signal frequency hopping at four distinct frequencies, and some white noise. The spectrogram and density histogram of FIG. 4 were generated by processing the signal under test with a single stage, such as that formed by filterbank windowing module 105 and first FT module 110 of FIG. 1. Accordingly, the spectrogram and density histogram encompass the entire frequency spectrum of the signal under test rather than selected sub-bands processed by the additional stages illustrated in FIG. 1. In contrast, the spectrogram and density histogram of FIGS. 5A and 5B were generated by processing four sub-bands of the signal under test using the multi-stage approach described with reference to FIGS. 1 through 3, and then overlaying the results of that processing.

A transform length of 4096 points was used to generate FIG. 4 while the processing in FIG. 5 was done with transform lengths of 8 and 512. As such, these figures have a comparable detail, but FIG. 5 could be generated with less processing. The displays in both FIGS. 4 and 5 used 512 horizontal pixels. In FIG. 5B, 3 different curves are visible. Curves C1 and C2 correspond to the 4 hopping chirp signals from FIG. 4B (Curve C1 represents the chirp moving downwards in frequency, curve C2 represents the chirp moving upwards in frequency). Due to the limited display resolution, curves C1 and C2 curves were not distinguishable in FIG. 4B. Curve C3 is a static carrier during a dead time of the frequency hopper.

The displays shown in FIGS. 5A and 5B may be used to perform rapid averaging of many pulses of a frequency hopping signal, thus increasing the signal to noise ratio possible within a given timeframe. Existing instruments can give similar resolution by zooming in on one portion of the frequency spectrum, but as only a subset of the signals would be captured they would have significantly worse signal to noise ratio. When done at full bandwidth, as in the example of FIGS. 4A and 4B, compute resources may be wasted on all the frequency domain noise left and right of the signal of interest thus limiting the feasible resolution.

The increased signal to noise ratio in FIGS. 5A and 5B is also discernible by comparing the relatively high density of noise in the density histogram of FIG. 4B with the relatively low noise of the density histogram of FIG. 5B. Another potential benefit of increased resolution is illustrated by the spectrogram of FIG. 5A, which shows a narrow static carrier that has all but disappeared in the spectrogram of FIG. 4A.

If anomalous results are found, a high precision frequency and/or density mask may be constructed. Where different subsets are found in the first stage of processing, a different mask may be loaded for comparison in the second stage of processing. As such, a full frequency/density mask resolution can be provided with a tuned-in instrument while still looking at all pulses regardless of where in the bandwidth they arrive. In addition, except for noise that typically is not required for further analysis the wide band view of FIGS. 4A and 4B is not lost but can be looked at in detail after a trigger goes off. The user thus has more information to refer to in determining a cause of the triggered condition. This approach does not require more compute resources although it will require more memory to store the whole set of frequency and/or density masks for each of the sub-bands.

FIG. 6 shows both detailed spectrum information and sub-band index information. In the illustrated example, different sub-band indices are distinguished by shading, but different indications such as numeric values, shapes, or colors could be used as well. In visualizations with enough space, such as that of FIG. 6, it could even become a mini spectrogram where the first stage amplitude rather than an index is encoded with different shading.

As illustrated in FIG. 7, the carrier frequency can also be used to provide a zoomed out combination spectrogram where the illustrated spectra constitute only a fraction of the total view and many lines are filled in with a "not measured" indication. Such a visualization does have some drawbacks, as it night break the time domain character of the signal in some locations when different sub-bands are selected because of slightly higher energy. To avoid this the analyzer requires enough parallel sub-band processing elements to ensure that there will never be more parallel input signals that processing elements. Alternatively the user can be informed about this issue so that he knows to ignore the time domain artifacts created due to this. Especially with touch based interfaces that make it easy and straight forward to zoom in and out this could be useful.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A method comprising:
applying filterbank windowing to an input signal to produce first samples in the time domain;
transforming the first samples in the time domain into first bins in the frequency domain such that the number of first bins is the same as the number of first samples;
selecting a sub-band of the input signal based on the first bins;
applying windowing to the sub-band to produce second samples in the time domain for the sub-band; and
transforming the second samples in the time domain into second bins in the frequency domain such that the number of second bins is the same as the number of second samples.

2. The method of claim 1, further comprising:
selecting another sub-band of the input signal based on the second bins;
applying windowing to the other sub-band to produce third samples in the time domain for the other sub-band; and
transforming the third samples in the time domain into third bins in the frequency domain such that the number of third bins is the same as the number of third samples.

3. The method of claim 1, further comprising analyzing the first bins and detecting the sub-band based on the analysis.

4. The method of claim 1, wherein the sub-band is selected based on a priori information regarding the input signal.

5. The method of claim 4, wherein the a priori information comprises a frequency hopping pattern of the input signal.

6. The method of claim 1, further comprising displaying information of the second bins on a spectrum analyzer.

7. The method of claim 6, further comprising displaying the information as a density histogram.

8. The method of claim 6, further comprising displaying the information as a spectrogram.

9. The method of claim 1, wherein the windowing applied to the sub-band to produce the second samples is filterbank windowing.

10. The method of claim 1, wherein the transform applied to the first samples is a Fourier transform.

11. The method of claim 1, wherein the transform applied to the second samples is a Fourier transform.

12. The method of claim 1, wherein the first samples are transformed using a Fourier transform having a first rate and the second samples are transformed using a Fourier transform having a second rate lower than the first rate.

13. A system comprising:
a filterbank that applies filterbank windowing to an input signal to produce first samples in the time domain; and
a digital signal processor that:
 transforms the first samples in the time domain into first bins in the frequency domain such that the number of first bins is the same as the number of first samples;
 selects a sub-band of the input signal based on the first bins;
 applying windowing to the sub-band to produce second samples in the time domain for the sub-band; and
 transforming the second samples in the time domain into second bins in the frequency domain such that the number of second bins is the same as the number of second samples.

14. The system of claim 13, further comprising a display that displays a density histogram based on the second bins.

15. The system of claim 14, wherein the density histogram comprises a curve.

16. The system of claim 13, further comprising a display that displays a spectrogram based on the second bins.

17. The system of claim 13, further comprising a detector that analyzes the first bins and detects the sub-band to be selected based on the analysis.

18. The system of claim 13, wherein the sub-band is selected based on a priori information regarding the input signal.

19. The system of claim 18, wherein the a priori information comprises a frequency hopping pattern of the input signal.

20. The system of claim 13, wherein the first samples are transformed using a Fourier transform having a first rate and the second samples are transformed using a Fourier transform having a second rate lower than the first rate.

* * * * *